United States Patent [19]

Gibson et al.

[11] 4,030,963

[45] June 21, 1977

[54] ARC-MELTING PREPARATION OF SINGLE CRYSTAL LAB$_6$ CATHODES

[75] Inventors: Edwin D. Gibson; John D. Verhoeven, both of Ames, Iowa

[73] Assignee: The United States of America as represented by the United States Energy Research and Development Administration, Washington, D.C.

[22] Filed: Jan. 27, 1976

[21] Appl. No.: 652,695

[52] U.S. Cl. ............................. 156/602; 156/620; 156/DIG. 63; 156/DIG. 86; 423/263; 423/289
[51] Int. Cl.$^2$ .................. B01J 17/10; C01B 35/18; C01F 17/00
[58] Field of Search ............ 156/602, DIG. 63, 620, 156/617 R, 617 H, 617 SP, 600, DIG. 86; 423/263, 289; 313/146, 311

[56] References Cited

UNITED STATES PATENTS

| | | | |
|---|---|---|---|
| 3,224,844 | 12/1965 | Gerthsen | 156/602 |
| 3,326,820 | 6/1967 | Cuomo et al. | 423/263 X |
| 3,410,666 | 11/1968 | Scott et al. | 156/602 |
| 3,442,719 | 5/1969 | Drabble et al. | 156/602 |

OTHER PUBLICATIONS

Lawson et al., "Preparation of Single Crystals", London, Butterworths Scientific Publications, p. 65, (1958).

*Primary Examiner*—Norman Yudkoff
*Assistant Examiner*—Barry I. Hollander
*Attorney, Agent, or Firm*—Dean E. Carlson; Frank H. Jackson; James W. Weinberger

[57] ABSTRACT

A method for preparing single crystals of lanthanum hexaboride (LaB$_6$) by arc melting a rod of compacted LaB$_6$ powder. The method is especially suitable for preparing single crystal LaB$_6$ cathodes for use in scanning electron microscopes (SEM) and scanning transmission electron microscopes (STEM).

5 Claims, 1 Drawing Figure

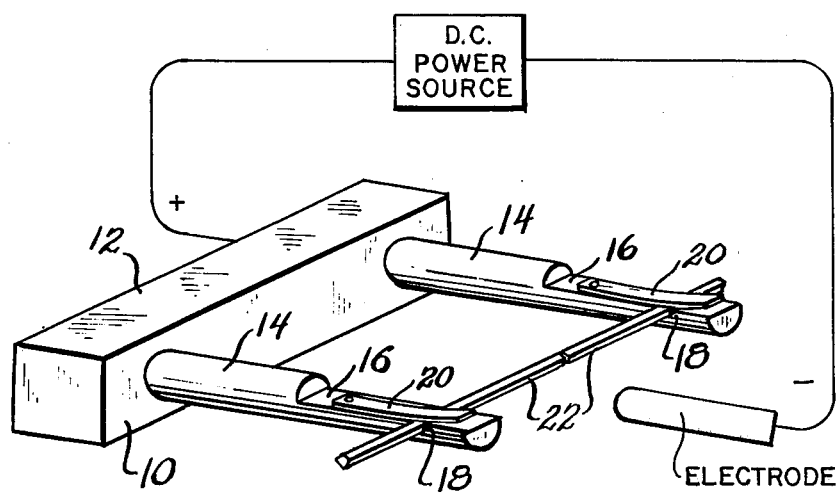

ARC-MELTING PREPARATION OF SINGLE CRYSTAL LAB$_6$ CATHODES

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

This invention relates to a method for preparing cathodes for use in scanning electron microscopes, and more specifically, this invention relates to a method for preparing single crystals of LaB$_6$ suitable for use as cathodes in electron guns in scanning electron microscopes (SEM) or scanning transmission electron microscopes (STEM).

In electron microscopes, the specimen under study is illuminated by focusing a beam of electrons on it with a system of magnetic lenses. The final image is then made visible by means of a florescent screen, or it can be photographed directly. In a scanning electron microscope, the electrons are focused down to a very fine beam which is then scanned across the surface of the specimen by pairs of magnetic coils. The electrons are collected in an electron detector and the final image is ultimately displayed on a cathode ray tube (CRT); the image being built up on the screen in synchronism with the scanning movement of the initial electron beam on the specimen surface. In the SEM, resolution directly depends upon the diameter of the scanning beam, its depth of penetration and upon the signal-to-noise ratio. For high resolution, the diameter of the scanning primary electron beam must be kept as small as possible. The current of this beam must be kept as high as necessary at the same time to have a good signal-to-noise ratio. In general, the source of electrons for this beam is provided by a hairpin-shaped cathode made of tungsten. The development of lanthanum hexaboride cathodes as a replacement for the tungsten hairpin filament in electron microscopes and similar devices has been described in the literature, *Journal of Applied Physics.* 38, 1991-2 (1967) A. N. Broers. In a subsequent report, *Journal Phys. E.* 2 273-6 A. N. Broers, a cathode electron gun using the LaB$_6$ cathode was described, which could, under proper operating conditions, provide brightness 15 to 20 times that of tungten cathodes operated at 40 hour life conditions.

The lanthanum hexaboride cathodes presently available are polycrystalline in structure, about 1 mm square and generally prepared by hot pressing and sintering highly purified lanthanum hexaboride powder to achieve a density on the order of 90 to 95% of the theoretical value. The tip of the cathode is then ground to a tip radii of from 4 to 12 $\mu$. It is known in the art that an improvement in brightness is obtained if one maintains the radius of curvature at the cathode tip as small as possible. Recent studies have shown that the emission of electrons from lanthanum hexaboride cathodes occurs at localized regions, called lobes, and that high brightness may be obtained only by correct positioning of these lobes in the electron column. The origin of these lobes is at present uncertain but it is believed that they are single crystals of lanthanum hexaboride which become prominent when the crystalline material evaporates from the grain boundaries at a faster rate than from the grains themselves so that an irregular shaped protrusion is formed on the top of the electrode. Since, as discussed previously, the flow of electrons emanates from the tip of the cathode, a single protrusion or lobe at the tip, if the radius is small, will generally cause little or no decrease in brightness. However, if as it often happens, two or more lobes are formed at the tip, the flow of electrons emanates from two or more of the lobes and the overall brightness of the electrode is decreased substantially with a corresponding decrease in microscope capability. While it is obviously possible to regrind the cathode tips to remove the offending lobes, such effort is time consuming since removal of cathodes from microscopes is difficult, as is the precise grinding of the tips. Thus, such removal for regrinding is expensive and does not always solve the problem.

One solution to the problem is the preparation of cathodes from single crystals which would offer greater control of lobe formation because of better control of structure and composition in single crystals. The preparation of single crystals of LaB$_6$ has been reported in *Materials Research Bulletin*, Vol. 1, 1966, pages 27-31, by a technique of zone melting using an induction heated zone melting apparatus. However, this technique requires very expensive equipment and produces large crystals from which individual cathodes must be machined.

SUMMARY OF THE INVENTION

We have developed a method by which we are able to quickly and easily prepare single crystals of lanthanum hexaboride suitable for use as electron-emitting cathodes in SEMs, STEMs and similar devices.

By the method of our invention for preparing single crystals of lanthanum hexaboride, a rod of compacted lanthanum hexaboride powder is mounted as an electrode in an electrode holder so that one end of the rod is free, the electrode holder being electrically connected to the positive terminal of a DC electrical source, striking an arc under an inert atmosphere between the free end of the rod and a second electrode electrically connected to the negative terminal of the power source, increasing the power from the electrical source until a small zone of molten lanthanum hexaboride powder is formed at the end of the rod and moving the second electrode slowly longitudinally along the rod while maintaining the power level constant, forming a moving zone of molten lanthanum hexaboride powder which then solidifies to a single crystal of lanthanum hexaboride.

The single crystals of lanthanum hexaboride which are prepared by the method of this invention are also useful for preparing cathodes which may have utility for any application which requires the ability to "write" very small patterns such as, for example, the preparation of electronic microcircuits by electron beam etching.

It is therefore the object of the invention to provide a method for preparing single crystals of lanthanum hexaboride.

It is another object of the invention to provide a method for preparing single crystals of lanthanum hexaboride which is simple and inexpensive.

Finally, it is the object of the invention to provide a simple and inexpensive method for preparing single crystals of lanthanum hexaboride which are suitable for the preparation of cathodes for use in scanning electron microscopes, scanning transmission electron microscopes and similar devices requiring pinpoint sources of electrons.

BRIEF DESCRIPTION OF THE DRAWING

The drawing is a perspective view of the electrode holder and mounted compacted lanthanum hexaboride rods for preparing the single crystals of the invention.

DETAILED DESCRIPTION OF THE PREFERRED EMBODIMENT

These and other objects of the invention may be met by mounting slidably longitudinally two rods of compacted lanthanum hexaboride powder electrodes in a electrode holder the rods being on the same longitudinal axis and having one free end, the free end of one rod touching the free end of the other rod, the holder being electrically connected to the positive terminal of a DC power source, striking an arc under an inert atmosphere, at the space between the rods with a second electrode electrically connected to the negative terminal of the DC power source, increasing the powder to a density of about 5 A/mm$^2$ thereby forming a small zone of molten lanthanum hexaboride powder at the space between the rods, and moving the second electrode slowly longitudinally along the rods while maintaining the power level constant to form a small moving zone of molten lanthanum hexaboride which solidifies to a single crystal of lanthanum hexaboride from the two rods.

The rods of lanthanum hexaboride may be prepared from crystalline or powdered material by any convenient manner, which may be cold pressing or by hot pressing and sintering. It is preferred that the material from which the rods are prepared be highly purified in order to facilitate crystal formation. For the purposes of this invention, rods of lanthanum hexaboride 99.9% pure, which were 1 mm square by about 3.5 cm in length, were prepared by hot pressing and sintering in a graphite die to achieve a density of 90 to 95% theoretical were used. However, single crystals would be expected to be prepared by the method of this invention from rods up to about 1 cm or larger in diameter.

While it is possible to prepare single crystals of lanthanum hexaboride from a single rod of compacted lanthanum hexaboride, the best results were obtained using the two rods of lanthanum hexaboride mounted on an electrode holder as hereinafter described.

Referring to the drawing, the fixed electrode holder 10 consists of a rectangular brass body 12 from which two parallel stainless steel rods 14 extend. The rods 14 each have flat surfaces 16 toward their outer ends into which V-shaped grooves 18 parallel to body 12 along the same longitudinal axis have been machined. Clips 20 of spring steel are fastened by one end to flat surfaces 16 and flexibly extend over V grooves 18. Mounted in V grooves 18 along the same longitudinal axis and held in place by spring clips 20 are two lanthanum hexaboride rods 22 placed end to end with the free ends of the rods touching lightly.

It has been found that the lanthanum hexaboride rods are susceptible to transverse fracture during this process due to thermal expansion and contraction as well as thermal shock. Thus by permitting the rods to expand longitudinally cracking due to thermal expansion and contraction is reduced. It is also important to reduce thermal shock which may produce a transverse crack where the arc is first struck on the lanthanum hexaboride rod. It has been found that by using two rods mounted end to end so that they just touch eliminated this fracturing problem.

The rods of lanthanum hexaboride must be melted under an inert atmosphere to prevent oxidation and evaporation of the lanthanum hexaboride. While an inert atmosphere such as helium is satisfactory, atmospheres of higher molecular weight gases such as argon or krypton are preferred to reduce evaporation. While atmospheric pressure is satisfactory for the process, slightly greater pressures are preferred to reduce evaporation.

The spatial orientation of the lanthanum hexaboride rods during melting is dependent upon the diameter of the rods and the size of crystals which are sought to be grown. For rods of about 1 mm in diameter suitable for use as cathodes, orientation is not important and can be either vertical or horizontal. For the preparation of single crystals from rods of larger diameter, a vertical orientation of the rods would be preferred to prevent the melted zone from falling out of the rod.

The amount of electrical power necessary to melt the rods to form a small molten zone is a function of the area of the rods and can readily be determined by one skilled in the art. Thus for rods about 1 mm square a power density of about 5 Amps/mm$^2$ was found satisfactory.

Power may be supplied from any DC power surface having sufficient voltage and 50 volts was found satisfactory for the preparation of crystals about 1 mm in diameter. It is important that the electrode holding the rods be connected to the positive terminal of the power supply so that the heating will take place in the rods.

In practice the second electrode, connected to the negative terminal of the power supply, which may be a rod of tantalum or tungsten, is brought close to the junction between the two rods positioned on the electrode shoulder until an arc is struck. Power is then slowly increased until a small molten zone appears at the junction of the two rods. The negative electrode is then slowly moved along the rods at a rate at which the rod just becomes molten as the electrode passes by and then cools and solidifies, forming a single crystal from the two rods as it solidifies. For LaB$_6$ rods about 1 mm square, the electrode was moved longitudinally at a rate of roughly 25 mm per minute. Improved results were obtained by monitoring and maintaining the current directly at a steady state once melting had been achieved. In this situation, crystals up to about 2.5 cm in length have been grown from compressed rods about 4 cm in length.

Once the single crystals have been prepared, they can be removed from the electrode holder, and cathodes suitable for use in electron microscopes or other devices may be prepared by methods well known to those skilled in the art.

One particular advantage which has been found for the single crystals prepared by the method of this invention is that the single crystals are attached to a sintered rod which has more compressive strength than do single crystals and thus can better stand the handling of being placed into a device for holding cathodes in electron microscopes.

EXAMPLE

A number of single crystals of lanthanum hexaboride were prepared from 1 mm square rods of hot pressed and sintered lanthanum hexaboride which was about 95% of theoretical density by the method of the invention as herein described. Cathodes were then prepared by grinding 90° angle tips on the crystals with a tip radius of between 2 and 5 μm. A number of the cathodes were then inserted in a Stereoscan S-4 scanning electron microscope and the brightness compared with the brightness of cathodes prepared in the same manner from hot pressed and sintered lanthanum hexaboride powder. Brightness measurements were made using a modified Faraday cage and are given in the table below.

TABLE

Summary of Experimental Results

| Cathode | Tip Radius μm | Brightness ($\beta$) $\beta$ Range of (20 KV) in MA/cm -ster | Ion Pump Capacity |
|---|---|---|---|
| 1-1 | ?-24 | .21 - .29 | 30 /s |
| 1-2 | 3-27 | .27 - .16 | " |
| 2-1 | 4-? | .33 - .21 | " |
| 2-2 | 2-27 | .69 - .26 | " |
| 2-3 | 3.5-3.5 | .09 - .05 | " |
| 2-4 | 3-30 | .57 - .01 | " |
| 3-2 | 2-2 | .54 - .04 | " |
| 4-1 | 3.5-? | .39 - .19 | " |
| 4-4 | 7 | .95 | 60 l/s |
| IS-1 | 12-12 | .95 - .76 | " |
| 2S-1 | 8-15 | 1.1 - .56 | " |
| 2S-2 | 6-52 | .82 - .35 | " |
| 3S-1 | 30 | .69 | " |
| 4S-1 | 3.5-3.1 | 1.1 - 0.91 | " |
| 3S-2 | 8-34 | .78 - 0.50 | " |

The S describes cathodes prepared from a single crystal. Brightness ($\beta$) is calculated from $$\beta = \frac{4I_d}{\pi^2 \alpha^2 d^2}$$

where $I_d$ is current in the beam of diameter $d$, and $\alpha$ the half angle of the beam divergence. Note the improved results with the larger ion pump.

The table above is intended to show only the improved reproducibility of the results which are obtainable using single crystal cathodes rather than an improvement with single crystals over polycrystalline cathodes, although improved cathode lifetimes are expected with the single crystals.

As can be seen from the preceding discussion and example, this invention provides a quick effective and inexpensive method for preparing single crystals of lanthanum hexaboride from which effective cathodes for use in electron microscopes and similar devices requiring concentrated sources of electron beams.

The embodiments of the invention in which an exclusive property or privilege is claimed are defined as follows:

1. A method for preparing single crystals of lanthanum hexaboride comprising:
    mounting two rods of compacted lanthanum hexaboride powder by one end as a first electrode on an electrode holder electrically connected to the positive terminal of a DC electrical power source the opposite end of each rod being free, said two rods of lanthanum hexaboride being mounted slidably longitudinally on the electrode holder, the rods being on the same longitudinal axis, the free end of one rod contacting the free end of the other rod striking an arc, under an inert atmosphere, at the point of contact between the rods with a second electrode electrically connected to the negative terminal of the power source;
    increasing the power from the electrical source until a small zone of molten lanthanum hexaboride powder is formed at the space between the rods; and
    moving the second electrode slowly longitudinally along both rods, while maintaining the power constant, thereby forming a small moving zone of molten lanthanum hexaboride powder along the rods, to form a single rod of a single crystal of lanthanum hexaboride.

2. The method of claim 1 wherein the lanthanum hexaboride rods are from about 1 mm to about 1 cm square in cross section.

3. The method of claim 2 wherein the lanthanum hexaboride rods are about 1 mm square in cross section.

4. The method of claim 2 wherein the power density is about 5 amps/mm².

5. The method of claim 3 wherein the inert atmosphere is selected from the group consisting of helium, argon and krypton.

* * * * *